US009865654B1

(12) United States Patent
He et al.

(10) Patent No.: US 9,865,654 B1
(45) Date of Patent: Jan. 9, 2018

(54) SEMICONDUCTOR STRUCTURE

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/399,747

(22) Filed: Jan. 6, 2017

(51) Int. Cl.
*H01L 47/00* (2006.01)
*H01L 27/24* (2006.01)
*H01L 45/00* (2006.01)

(52) U.S. Cl.
CPC .......... *H01L 27/2436* (2013.01); *H01L 45/06* (2013.01); *H01L 45/1233* (2013.01); *H01L 45/143* (2013.01); *H01L 45/144* (2013.01)

(58) Field of Classification Search
CPC . H01L 27/2436; H01L 45/06; H01L 45/1233; H01L 45/143; H01L 45/144
USPC .......................................................... 257/4
See application file for complete search history.

(56) References Cited

U.S. PATENT DOCUMENTS

| 9,362,492 | B2 | 6/2016 | Goktepeli et al. | |
|---|---|---|---|---|
| 2007/0158631 | A1* | 7/2007 | Daley | H01L 45/06 257/2 |
| 2012/0231603 | A1* | 9/2012 | Im | H01L 45/06 438/382 |
| 2013/0051115 | A1* | 2/2013 | En | H01L 27/0694 365/148 |
| 2014/0063925 | A1* | 3/2014 | Friedman | G11C 13/0004 365/163 |
| 2014/0209852 | A1 | 7/2014 | Schulze et al. | |

OTHER PUBLICATIONS

Shim et al., RF Switches Using Phase Change Materials, Jan. 2013.

* cited by examiner

*Primary Examiner* — Vu A Vu
(74) *Attorney, Agent, or Firm* — Winston Hsu

(57) ABSTRACT

A semiconductor structure includes a front side and a back side opposite to the front side, at least a transistor device formed on the front side of the substrate, and an adjustable resistor formed on the back side of the substrate. The adjustable resistor includes at least a phase change material PCM layer.

11 Claims, 1 Drawing Sheet

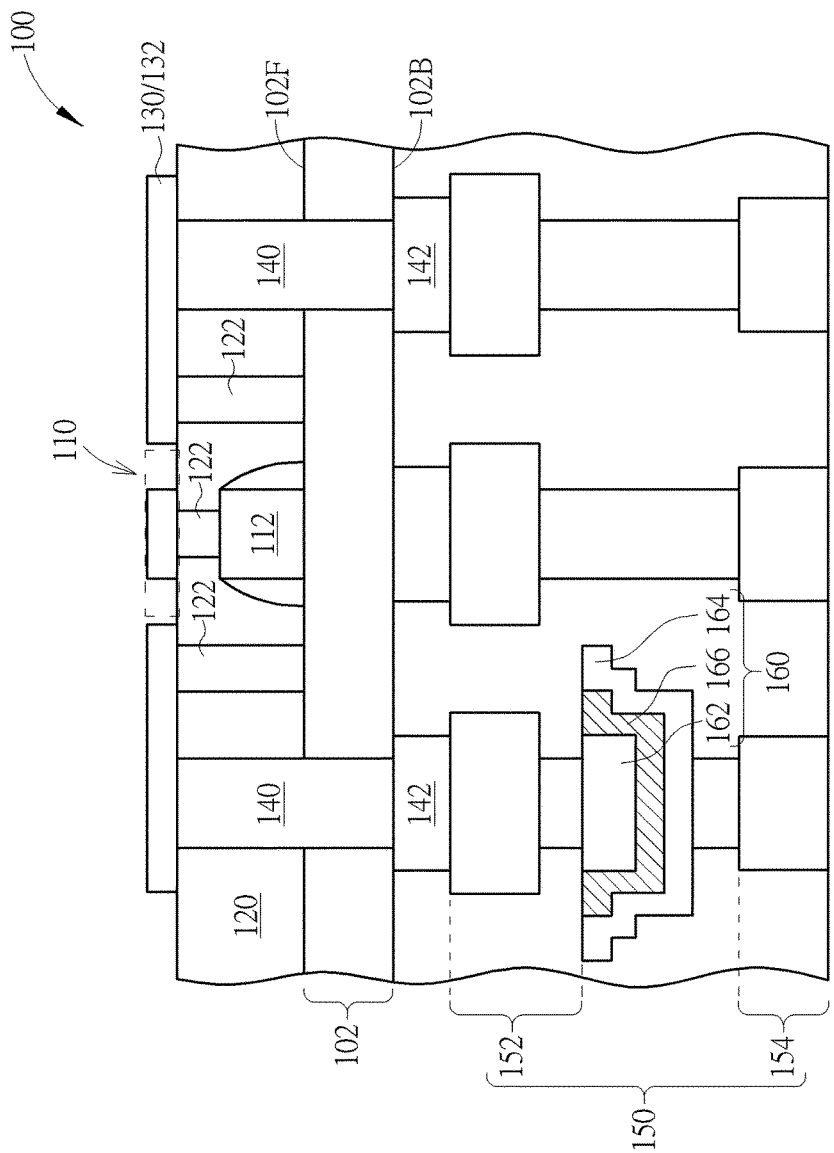

US 9,865,654 B1

SEMICONDUCTOR STRUCTURE

BACKGROUND OF THE INVENTION

1. Field of the Invention

The present invention relates to a semiconductor device, and more particularly, to a radio-frequency (RF) switch implemented with the semiconductor structure.

2. Description of the Prior Art

Switching devices are implemented in a variety of applications. For example, switching devices can be implemented for logic circuit and computing applications, for RF-signal switching in front-end receiver systems, for RF transmitter systems, and other applications. Traditional transistor technologies such as metal-oxide-semiconductor (MOS) transistors fabricated using doped silicon are able to serve as transistor switching devices. However, transistor switching devices generally occupy a sizeable space of a semiconductor wafer, and can consume significant power in maintaining activation of the switches for a given switching state. Other switching devices can be implemented with, for example, micro-electro-mechanical systems (MEMS) processing. However, MEMS processing can be expensive and difficult, and specialized packaging constraints is required. Furthermore, switching losses and activation power consumptions are still exhibited.

There is therefore a continuing need in the semiconductor processing art to develop a solution for the switching devices.

SUMMARY OF THE INVENTION

According to an aspect of the present invention, a semiconductor structure is provided. The semiconductor structure includes a substrate including a front side and a back side opposite to the front side, at least a transistor device formed on the front side of the substrate, and an adjustable resistor formed on the back side of the substrate. And the adjustable resistor includes at least a phase change material (hereinafter abbreviated as PCM) layer.

According to the semiconductor structure provided by the present invention, the adjustable resistor including the PCM layer is formed on the back side of the substrate. The PCM layer exhibits low and high resistances at different states, therefore the adjustable resistor including the PCM layer serves as a superior switching device that is a fast, small form factor, and can be readily integrated with MEMS and CMOS electronics.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE is a schematic drawing illustrating a semiconductor structure provided by a preferred embodiment of the present invention.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention maybe practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Please refer to the FIGURE, which is a schematic drawing illustrating a semiconductor structure provided by a preferred embodiment of the present invention. As shown in the FIGURE, the semiconductor structure 100 includes a substrate 102. The substrate 102 can be formed of a variety of mechanically supportive materials. For example, the substrate 102 may include, for example but not limited to, silicon (Si), silicon germanium (SiGe), or other suitable semiconductor substrate used in the semiconductor manufacturing industry, and the substrate 102 may be a p-type or an n-type substrate material. Also, as shown in the FIGURE, the substrate 102 includes a front side 102F and a back side 102B. Active components (not shown) such as transistor device(s) 110 and diodes that are able to control electrical currents, and passive components (not shown) such as capacitors, inductors, resistors, and transformers that are able to create a relationship between voltage and current necessary to perform electrical circuit functions are formed over the front side 102F of the substrate 102 by a series of process steps including doping, deposition, photolithography, etching, and planarization. Device designs for the above mentioned active/passive devices and the details of front-end-of-line (FEOL) process should be familiar to a person having ordinary skill in the art. For example but not limited to, by performing deposition, photolithography, etching, and doping, the transistor device 110 including a gate 112, a source/drain (not shown), and a spacer formed on sidewalls of the gate 112 is obtained. The above mentioned active and passive components are electrically connected to form functional electrical circuits. It should be noted that those active and passive components except the transistor device 110 are omitted from the FIGURE in the interest of brevity.

An inter-layer dielectric (hereinafter abbreviated as ILD) layer 120 and a plurality of contact plugs 122 formed in the ILD layer 120 can be built on the front side 102F of the substrate 102 for constructing electrical connections between the abovementioned electrical devices/components. Furthermore, a back-end-of-line (BEOL) interconnection structure 130 is formed on front side 102F of the substrate 102. The interconnection structure 130 interconnects the active/passive components of the integrated circuit(s) and may provide circuit-to-circuit connections, or may establish contacts with input and output terminals. The interconnection structure 130 can include a plurality of dielectric layers (not shown) such as interlayer dielectric layers or inter-metal dielectric (IMD) layers and a plurality of metal layers (including wires and vias) formed in the IMD layer. Typically speaking, the wires are defined depending on where it is placed. For example, the wires are upwardly defined as a first metal layer M1, a second metal layer M2, . . . and so on to an nth metal layer Mn. It should be easily understood to those skilled in the art that only the lowest metal layer 132, that is the first metal layer M1 of the interconnection structure 130 is shown in the FIGURE, and the upper wires and vias are omitted for simplicity.

Please still refer to the FIGURE, the semiconductor structure 100 provided by the preferred embodiment of the present invention also includes at least a through-silicon-via (TSV) structure 140 formed therein. The TSV structure 140 allows electrical interconnection between two or more wafers bonded to each other in a three-dimensional (3D) wafer stack. It is therefore concluded that TSV structures are important components of 3D ICs. Furthermore, the TSV structure 140 shows superior applicability and can be found in RF devices, MEMS, complementary metal-oxide-semiconductor (CMOS) image sensors, flash, dynamic random access memory (DRAM), static random access memory (SRAM), analog devices, and logic devices. Conventionally, the TSV structure 140 is formed by deep etching into the substrate 102, and filling the resulting hole with a liner, a diffusion barrier layer, and a conductive filling layer. Then, the substrate 102 is thinned from its backside, until the conductive filling layer is exposed, and a backside metal and/or bump 142 is formed on the thinned back side 102B of the substrate 102 for electrical contact.

Please still refer to the FIGURE. A connection structure 150 is formed on the back side 102B of the substrate 102. As shown in the FIGURE, the connection structure 150 can be electrically connected to the TSV structure 140 by the metal and/or bump 142. In fact, the TSV structure 140 electrically connects the interconnection structure 130 formed on the front side 102F of the substrate 102 and the connection structure 150 formed on the back side 102B of the substrate 102. Additionally, the connection structure 150 can include a first portion 152 and a second portion 154 in accordance with the preferred embodiment, and the first portion 152 can be electrically connected to the metal and/or bump 142. More important, the semiconductor structure 100 provided by the present invention includes an adjustable resistor 160 formed on the back side 102B of the substrate 102. And the adjustable resistor 160 is sandwiched in between the first portion 152 and the second portion 154 of the connection structure 150. The adjustable resistor 160 includes a first electrode 162, a second electrode 164, and a PCM layer 166 sandwiched in between the first electrode 162 and the second electrode 164. In some embodiments of the present invention, the first portion 152 of the connection structure 150 is electrically connected to the first electrode 162 of the adjustable resistor 160, and the second portion 154 of the connection structure 150 is electrically connected to the second electrode 164 of the adjustable resistor 160. In some embodiment of the present invention, the transistor device 110 formed on the front side 102F of the substrate 102 and the adjustable resistor 160 formed on the back side 102B of the substrate 102 are electrically connected. In detail, the transistor device 110 and the first electrode 162 of the adjustable resistor 160 are electrically connected by the first portion 152 of the connection structure 150, the metal and/or bump 142, the TSV structure 140, and the interconnection structure 130 as shown in the FIGURE. And the second electrode 164 of the adjustable resistor 160 is electrically connected to another device or terminal. Additionally, in some embodiments of the present invention, the transistor device 110 and the adjustable resistor 160 are electrically connected by higher-level metal wires such as, for example but not limited to, the sixth metal layer (M6) of the interconnection structure 130, such that larger currents are allowed to access.

Referring to the adjustable resistor 160, the first electrode 162 and the second electrode 164 of the adjustable resistor 160 include metal material, and the metal material can include aluminum (Al), tungsten (W), or copper (Cu). A thickness of the PCM layer 166 is smaller than 50 nanometers (nm), but not limited to this. The PCM layer 166 can be formed from a variety of phase change materials exhibit variable electrical resistivity that is dependent on crystalline states. For example but not limited to, the PCM layer 166 can include germanium telluride (GeTe), germanium selenide (GeSe), germanium antimony telluride (GeSbTe), or germanium selenium telluride (GeSeTe). In detail, the PCM layer 166 exhibits a relative low resistance at the crystalline state and a relative high resistance at the amorphous state. Therefore the PCM layer 166 sandwiched in between the first electrode 162 and the second electrode 164 serves as an Ohmic switch, and thus the resistor formed by the first electrode 162, the PCM layer 166 and the second electrode 164 is adjustable. In some embodiments of the present invention, the PCM layer 166 include a crystalline state and is recognized as at ON state at a first voltage equal to or smaller than 1.5V, and the resistance of the adjustable resistor 160 is lower than several Ohms (Ω) such as lower than 5Ω at the first voltage. In some embodiments of the present invention, the PCM layer 166 includes an amorphous state and is recognized at OFF state at a second voltage equal to or larger than 2V, and the resistance of the adjustable resistor 160 is larger than 10Ω, even larger than thousands Ohms, at the second voltage. According to the semiconductor structure 100 provided by the present invention, the adjustable resistor 160 provides a superior bi-mode performance for a device such as the low noise analog (LNA) RF device: when a large resistance is required to improve linearity of the device, the PCM layer 166 is turned to OFF state. On the other hand, when a small resistance is required to improve current-gain (β), the PCM layer 166 is turned to ON state.

Briefly speaking, according to the semiconductor structure provided by the present invention, the adjustable resistor including the PCM layer is formed on back side of the substrate. Since the PCM layer exhibits low and high resistances at different voltages, the adjustable resistor enables application of both low and high resistances. Furthermore, the adjustable resistor is compatible with CMOS and/or MEMS process and can be readily integrated with CMOS and/or MEMS electronics.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
a substrate comprising a front side and a back side opposite to the front side;
at least a transistor device formed on the front side of the substrate;
an adjustable resistor formed on the back side of the substrate, the adjustable resistor comprising at least a phase change material (PCM) layer, wherein the adjustable resistor further comprises a first electrode and a second electrode, and the PCM layer is sandwiched in between the first electrode and the second electrode;
a connection structure formed on the back side of the substrate, and the connection structure comprising a first portion and a second portion;
at least an interconnection structure formed on the front side of the substrate; and
at least a through-silicon-via (TSV) structure electrically connecting the interconnection structure formed on the front side of the substrate and the connection structure formed on the back side of the substrate, wherein the interconnection structure is formed above the transistor device, and the transistor device and the first electrode of the adjustable resistor are electrically connected by the first portion of the connection structure, the TSV structure, and the interconnection structure.

2. The semiconductor structure according to claim 1, wherein the transistor device and the adjustable resistor are electrically connected.

3. The semiconductor structure according to claim 1, wherein the first electrode and the second electrode comprise metal material.

4. The semiconductor structure according to claim 1, wherein the adjustable resistor is sandwiched in between the first portion and the second portion of the connection structure.

5. The semiconductor structure according to claim 4, wherein the first portion of the connection structure is electrically connected to the first electrode of the adjustable resistor, and the second portion of the connection structure is electrically connected to the second electrode of the adjustable resistor.

6. The semiconductor structure according to claim 1, wherein the PCM layer comprises germanium telluride (GeTe), germanium selenid (GeSe), germanium antimony telluride (GeSbTe), or germanium selenium telluride (GeSeTe).

7. The semiconductor structure according to claim 1, wherein a thickness of the PCM layer is smaller than 50 nanometers (nm).

8. The semiconductor structure according to claim 1, wherein the PCM layer comprises a crystalline state at a first voltage, and the first voltage is equal to or smaller than 1.5V.

9. The semiconductor structure according to claim 8, wherein a resistance of the adjustable resistor is lower than 5 Ohms ($\Omega$) at the first voltage.

10. The semiconductor structure according to claim 1, wherein the PCM layer comprises an amorphous state at a second voltage, and the second voltage is equal to or larger than 2V.

11. The semiconductor structure according to claim 10, wherein a resistance of the adjustable resistor is larger than 10$\Omega$ at the second voltage.

* * * * *